(12) United States Patent
Lin et al.

(10) Patent No.: US 11,460,255 B2
(45) Date of Patent: Oct. 4, 2022

(54) VAPOR CHAMBER DEVICE AND MANUFACTURING METHOD THEREOF

(71) Applicant: UNIMICRON TECHNOLOGY CORP., Taoyuan (TW)

(72) Inventors: Pu-Ju Lin, Hsinchu (TW); Ying-Chu Chen, Chiayi (TW); Wei-Ci Ye, Taichung (TW); Chi-Hai Kuo, Taoyuan (TW); Cheng-Ta Ko, Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 17/113,332

(22) Filed: Dec. 7, 2020

(65) Prior Publication Data

US 2022/0146207 A1 May 12, 2022

(30) Foreign Application Priority Data

Nov. 9, 2020 (TW) .................................. 109139056

(51) Int. Cl.
| | |
|---|---|
| *B23P 15/26* | (2006.01) |
| *F28D 15/04* | (2006.01) |
| *C23F 17/00* | (2006.01) |
| *H05K 7/20* | (2006.01) |
| *H01L 23/427* | (2006.01) |

(52) U.S. Cl.
CPC ............ *F28D 15/043* (2013.01); *B23P 15/26* (2013.01); *C23F 17/00* (2013.01); *H05K 7/20336* (2013.01); *B23P 2700/09* (2013.01); *H01L 23/427* (2013.01)

(58) Field of Classification Search
CPC .... F28D 15/043; B23P 15/26; B23P 2700/09; C23F 17/00; H05K 7/20336; H01L 23/427
See application file for complete search history.

(56) References Cited

U.S. PATENT DOCUMENTS

| 9,627,347 B2 | 4/2017 | Aoyagi et al. | |
| 2022/0107136 A1* | 4/2022 | Takahashi | .......... H05K 7/20309 |

FOREIGN PATENT DOCUMENTS

| CN | 201410137405 | 10/2015 |
| CN | 110715570 | 1/2020 |
| CN | 110740612 | 1/2020 |
| TW | M336670 | 7/2008 |
| TW | M593721 | 4/2020 |

* cited by examiner

*Primary Examiner* — Rick K Chang
(74) *Attorney, Agent, or Firm* — WPAT, PC

(57) ABSTRACT

A vapor chamber device and a manufacturing method are disclosed. The vapor chamber has a housing and multiple independent chambers. The housing includes two shells opposite to each other. The independent chambers are formed between the two shells. Each independent chamber contains a working fluid and has at least one diversion bump and a capillary structure. The diversion bump is formed on an inner surface of the second shell, and the capillary structure is mounted on the diversion bump. When the vapor chamber device is vertically mounted to a heat source, the independent chambers at an upper portion of the vapor chamber device still contain the working fluid. The working fluid in the independent chambers may not all flow to a bottom of the vapor chamber device. Therefore, a contact area between the working fluid and the heat source is increased and heat dissipation efficiency is improved.

10 Claims, 15 Drawing Sheets

VAPOR CHAMBER DEVICE AND MANUFACTURING METHOD THEREOF

BACKGROUND OF THE INVENTION

1. Field of the Invention

The present invention relates to a vapor chamber device and a manufacturing method thereof, in particular to a vapor chamber device that has multiple independent chambers.

2. Description of the Prior Arts

A vapor chamber is a common cooling device, which has a flat housing with a sealed chamber. The chamber is provided with a capillary tissue and a heat transfer fluid therein. One side of the flat housing is provided to contact a heat source, such as the CPU of a smart device. Then the heat transfer fluid in the vapor chamber can absorb the heat generated from the heat source and is evaporated into vapor. As the other side of the flat housing opposite to the side contacting the heat source dissipates heat, the vapor can condense back to liquid, thereby achieving the purpose of heat dissipation.

As the heat transfer fluid in the vapor chamber flows to the bottom of the sealed chamber due to gravity, the vapor chamber is usually horizontally attached to the heat source to make the heat transfer fluid close to the heat source to achieve heat dissipation.

However, when the heat source is moved or turned over, the vapor chamber horizontally mounted on the heat source may be turned over to be attached to the side of the heat source in the vertical direction. At this time, the heat transfer fluid in the vapor chamber flows to the bottom of the vapor chamber due to gravity and cannot be close enough to the heat source, which results in poor heat dissipation efficiency.

SUMMARY OF THE INVENTION

In view of the above problems, the present invention provides a vapor chamber device and a manufacturing method thereof, which can solve the problems of poor heat dissipation efficiency due to insufficient contact between the heat dissipation fluid and the heat source when the vapor chamber device is in vertical contact with the heat source.

The vapor chamber device comprises:
  a housing having a first shell and a second shell, wherein the first shell is opposite to the second shell; and
  multiple chambers formed between the first shell and the second shell; wherein each of the chambers is provided with
    a working fluid;
    at least one diversion bump formed on an inner surface of the second shell; and
    a capillary structure mounted on an end of the at least one diversion bump.
  In an embodiment, the housing further comprises:
    at least one partition wall mounted between the first shell and the second shell, and two opposite ends of the at least one partition wall being respectively connected to the first shell and the second shell to separate the multiple chambers from one another.

The manufacturing method of a vapor chamber device comprises:
  providing a first substrate;
  forming a first annular convex portion, at least one first partition portion, and multiple diversion bumps on the first substrate, wherein the diversion bumps are separated by the at least one first partition portion and the at least one first partition portion separates an inner area within the first annular convex portion into multiple first chambers;
  mounting a capillary structure on one end of each diversion bump;
  providing a second substrate;
  forming a second annular convex portion and at least one second partition portion on the second substrate;
  joining the first substrate and the second substrate; wherein the first annular convex portion of the first substrate is joined to the second annular convex portion of the second substrate, and the at least one first partition portion of the first substrate is connected to the at least one second partition portion of the second substrate;
  injecting a working fluid into the first chambers in the inner area within the first annular convex portion of the first substrate and evacuating the first chambers; and
  compressing the first substrate and the second substrate, wherein one end of the first annular convex portion of the first substrate is tightly fitted with one end of the second annular convex portion of the second substrate, and one end of each of the at least one first partition portion of the first substrate is tightly fitted with one end of each of the at least one second partition portion of the second substrate.

In an embodiment, the method further comprises:
  when the capillary structure is mounted on the end of each diversion bump, placing multiple pipes on the end of the first annular convex portion; wherein the multiple pipes respectively fluidly communicate the first chambers within the inner area of the first annular convex portion of the first substrate;
  injecting the working fluid into the first chambers and evacuating the first chambers through the pipes;
  after compressing the first substrate and the second substrate, cutting off the pipes that are exposed from the first substrate and the second substrate.

In an embodiment, the method further comprises:
  after forming the first annular convex portion, the at least one first partition portion and the diversion bumps on the first substrate, further forming multiple first joining portions on the end of the first annular convex portion;
  after forming the second annular convex portion and the at least one second partition portion on the second substrate, further forming multiple second joining portions on the end of the second annular convex portion; and
  when joining the first substrate and the second substrate, further connecting the first joining portions of the first substrate and the second joining portions of the second substrate.

In an embodiment, the step of forming the first annular convex portion, the at least one first partition portion, and the diversion bumps on the first substrate further comprises:
  forming a first patterned photoresist layer on the first substrate, the first patterned photoresist layer defined with multiple first patterned opening regions;
  etching the first substrate exposed from the first patterned opening regions; and
  removing the first patterned photoresist layer to form the first annular convex portion, the at least one first partition portion and the diversion bumps on the first substrate.

In an embodiment, the step of forming multiple first joining portions at the end of the first annular convex portion comprises:
  forming a second patterned photoresist layer on the first substrate, the second patterned photoresist layer being defined with multiple second patterned opening regions corresponding to the end of the first annular convex portion;

etching the end of the first annular convex portion exposed from the second patterned opening regions;

removing the second patterned photoresist layer to form the first joining portions on the end of the first annular convex portion.

In an embodiment, the step of forming the second annular convex portion and the at least one second partition portion on the second substrate comprises:

forming a third patterned photoresist layer on the second substrate, the third patterned photoresist layer being defined with multiple third patterned opening regions;

etching the second substrate exposed from the third patterned opening regions; and removing the third patterned photoresist layer to form the second annular convex portion and the at least one second partition portion on the second substrate.

In an embodiment, the step of forming multiple second joining portions at the end of the second annular convex portion comprises:

forming a fourth patterned photoresist layer on the first substrate, the fourth patterned photoresist layer being defined with multiple fourth patterned opening regions corresponding to the end of the second annular convex portion;

etching the end of the second annular convex portion exposed from the fourth patterned opening regions;

removing the fourth patterned photoresist layer to form the second joining portions at the end of the second annular convex portion.

In an embodiment, the second joining portions are formed by electroplating.

Based on the above, since the vapor chamber device has multiple independent chambers and each chamber has a working fluid, when the second shell of the vapor chamber device is vertically mounted above a heat source, the working fluid of each chamber can dissipate heat. When the vapor chamber device is turned over to be vertically arranged on the side of the heat source, as each independent chamber has the working fluid, the working fluid only flows to a bottom of each chamber due to gravity rather than the bottom of the vapor chamber device. Therefore, when the vapor chamber device is vertically arranged on the side of the heat source, the chamber at an upper portion of the vapor chamber device still contains the working fluid, which increases a contact area between the working fluid and the heat source and improves heat dissipation efficiency.

DETAILED DESCRIPTION OF THE PREFERRED EMBODIMENTS

Figure 1A:
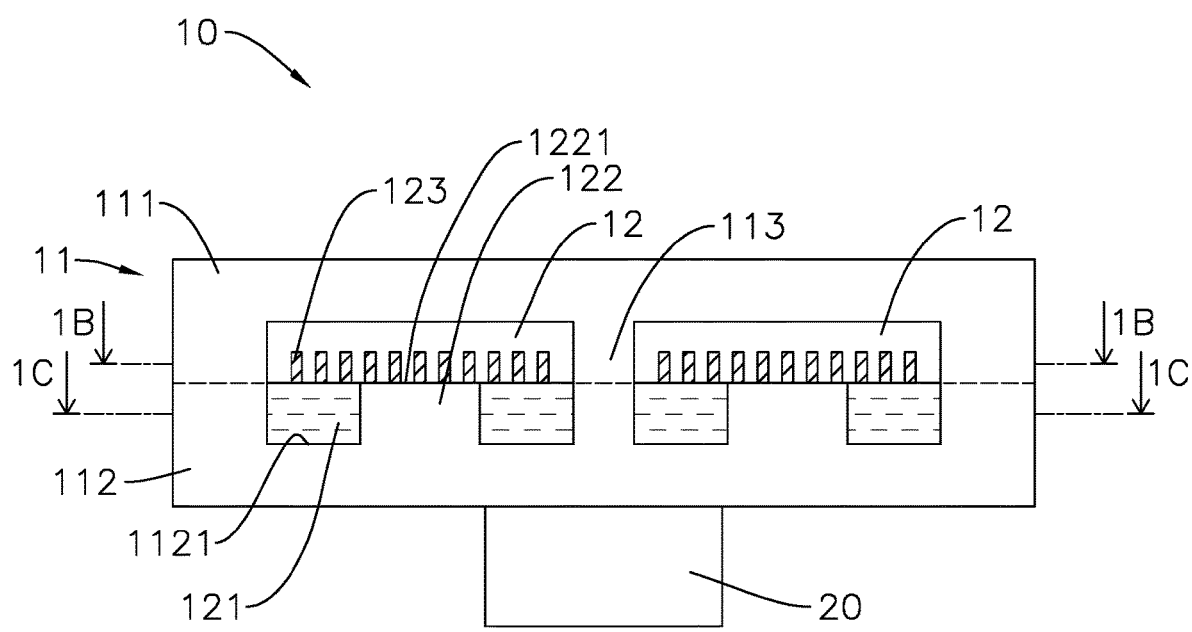
FIG. 1A is a cross-sectional side view of a vapor chamber device placed horizontally according to one embodiment of the present invention.
Figure 1B:
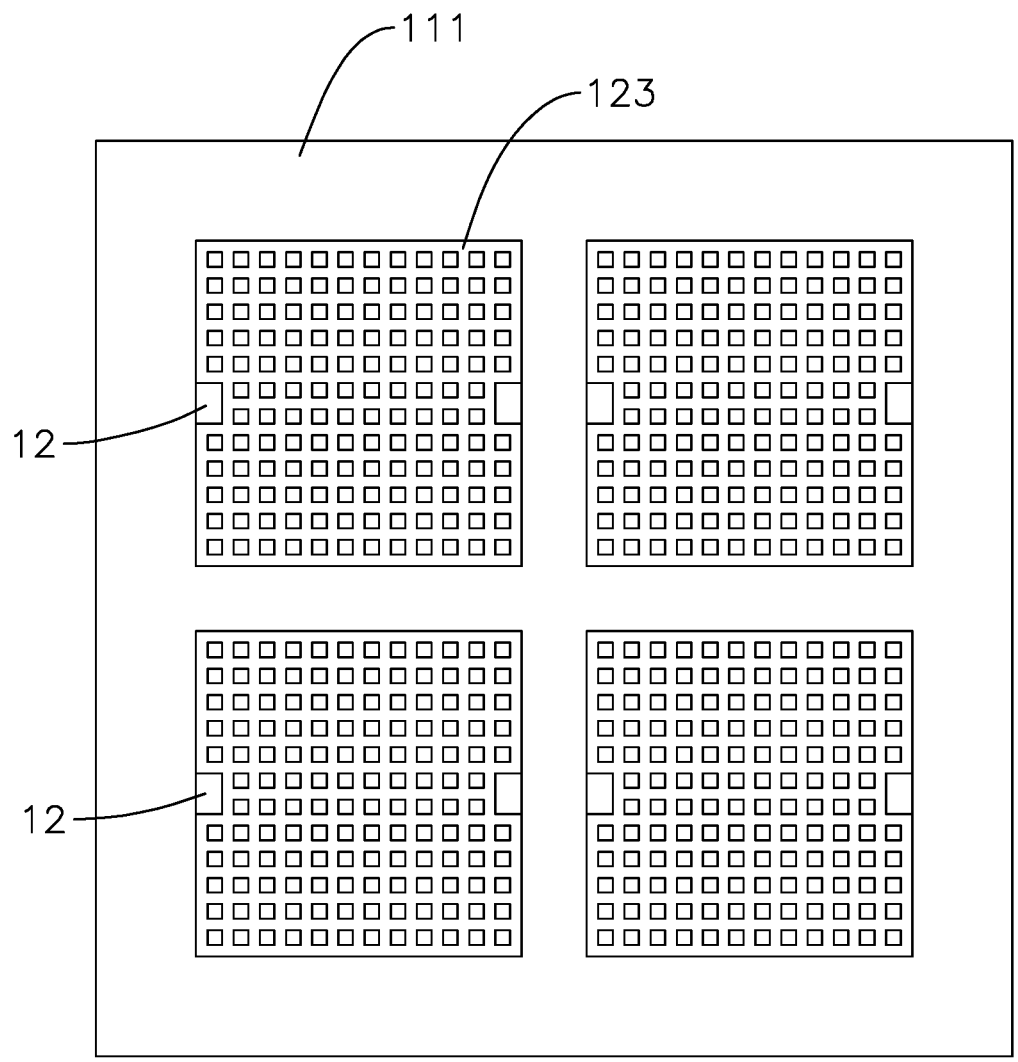
FIG. 1B is a schematic top sectional view of a vapor chamber device taken across the cutting line 1B-1B in FIG. 1A according to one embodiment of the present invention.
Figure 1C:
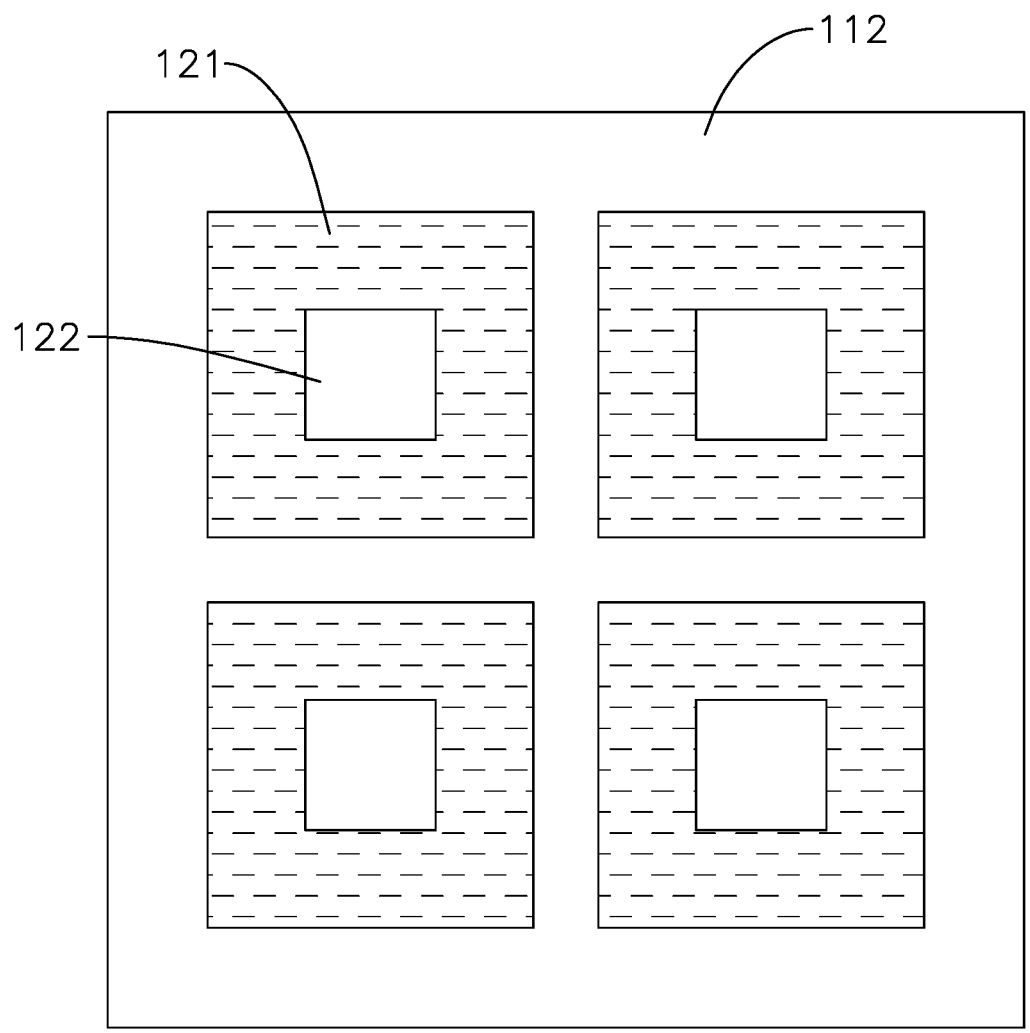
FIG. 1C is another top cross-sectional schematic diagram of a vapor chamber device taken across the cutting line 1C-1C in FIG. 1A according to one embodiment of the present invention.

Referring to FIGS. 1A to 1C, in this embodiment, a vapor chamber device 10 includes a housing 11 and multiple independent chambers 12. The housing has a first shell 111 and a second shell 112 opposite to each other. The multiple independent chambers 12 are formed between the first shell 111 and the second shell 112. Each of the chambers 12 is provided with a working fluid 121, at least one diversion bump 122 and a capillary structure 123. The at least one diversion bump 122 is formed on an inner surface 1121 of the second shell 112, and the capillary structure 123 is mounted on an end 1221 of the at least one diversion bump 122.

In addition, the housing 11 of the vapor chamber device 10 further includes at least one partition wall 113. The at least one partition wall 113 is disposed between the first shell 111 and the second shell 112. Two opposite ends of the at least one partition wall 113 are respectively connected to the first shell 111 and the second shell 112 to separate the chambers 12 from each other.

Figure 1D:
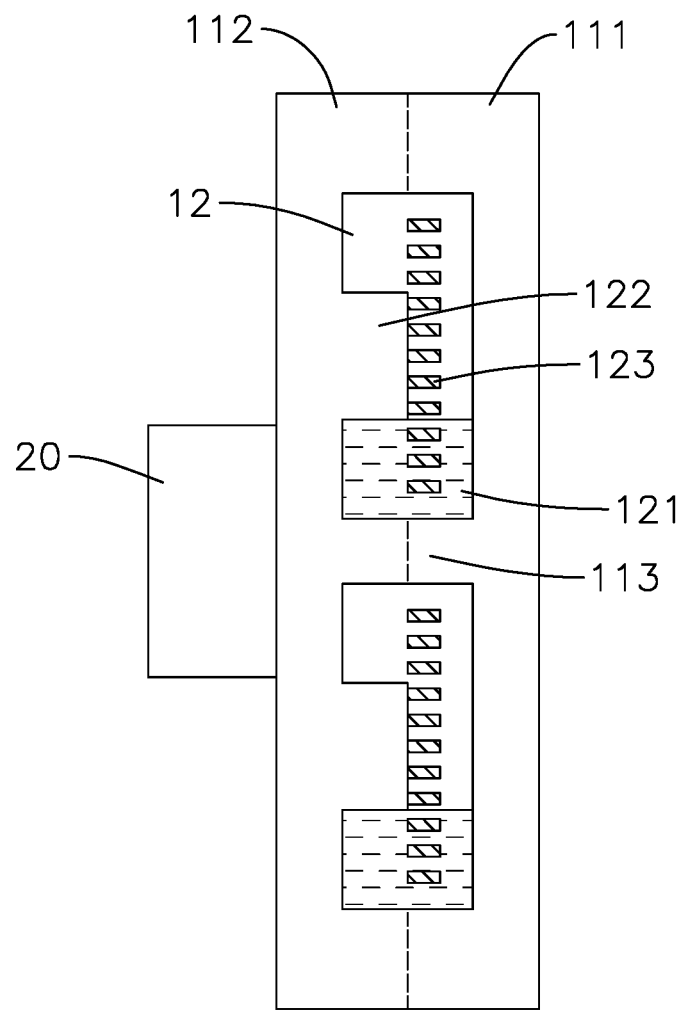
FIG. 1D is a cross-sectional side view of a vapor chamber device placed vertically according to one embodiment of the invention.

Referring to FIG. 1A and FIG. 1D, the vapor chamber device 10 has multiple independent chambers 12, and each chamber 12 contains a working fluid 121 therein. Referring to FIG. 1A, when the vapor chamber device 10 is in use, the second shell 112 is horizontally attached to a heat source 20. Then the working fluid 121 in each independent chamber 12 can dissipate heat of the heat source 20. Referring to FIG. 1D, when the vapor chamber device 10 is turned over to be vertically arranged on the side of the heat source 20, as each chamber 12 has the working fluid 121 and the multiple chambers 12 do not fluidly communicate each other, the working fluid 121 only flows to a bottom of each chamber 12 due to gravity rather than flows to a bottom of the vapor chamber device 10. Therefore, when the vapor chamber device 10 is vertically arranged on the side of the heat source 20, the chambers 12 at an upper portion of the vapor chamber device 10 still contain the working fluid 121, which increases a contact area between the working fluid 121 and the heat source 20 and improves heat dissipation efficiency.

FIGS. 2A to 2F, and FIG. 2F' are schematic cross-sectional views of processing a first substrate of a vapor chamber device according to one embodiment of the present invention.

Figure 2A:
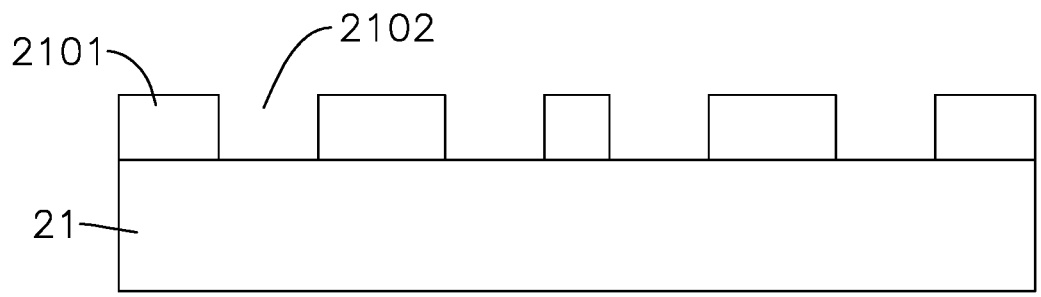
FIGS. 2A to 2F, and FIG. 2F' are schematic cross-sectional views of processing a first substrate of a vapor chamber device according to one embodiment of the present invention.
Figure 2B:
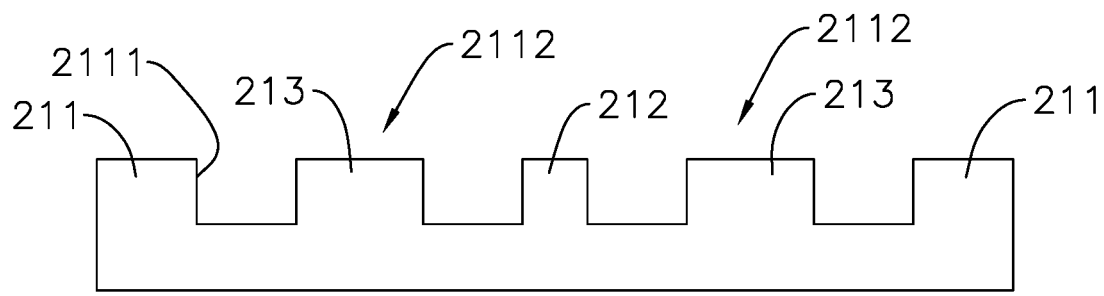

Referring to FIGS. 2A and 2B, a first substrate 21 is provided and a first patterned photoresist layer 2101 is formed on the first substrate 21. The first patterned photoresist layer 2101 is defined with multiple first patterned opening regions 2102. In some embodiments, the material of the first substrate 21 is a metal or metal alloy with good thermal conductivity, such as copper or its alloy. The first patterned photoresist layer 2101 and the first patterned opening regions 2102 can be obtained by spin coating, dry film photoresist patterning, etc., then being patterned by exposure to form the first patterned photoresist layer 2101 and the first patterned opening regions 2102.

Referring to FIG. 2B, the first substrate 21 exposed from the first patterned opening regions 2102 is etched, then the first patterned photoresist layer 2101 is removed to form a first annular convex portion 211, at least one first partition portion 212, and multiple diversion bumps 213 on the first substrate 21. The diversion bumps 213 are separated by the at least one first partition portion 212. An inner area 2111 of the first annular convex portion 211 is separated by the at least one first partition portion 212 into multiple first chambers 2112.

Figure 2C:
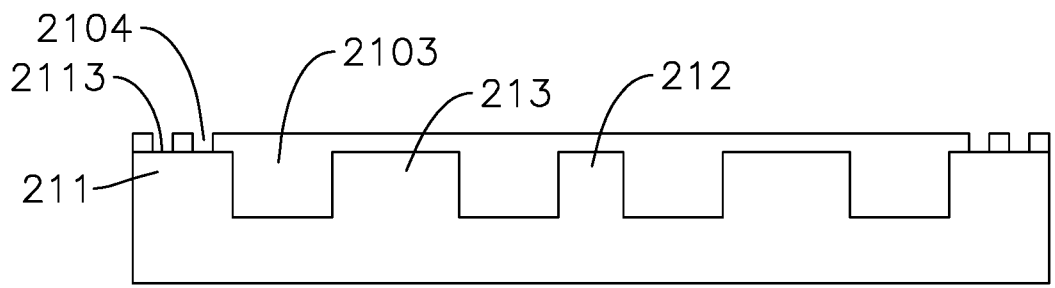

Referring to FIG. 2C, a second patterned photoresist layer 2103 is provided on the first substrate 21 and defined with multiple second patterned opening regions 2104. The second patterned open regions 2104 correspond to an end 2113 of the first annular convex portion 211. In this embodiment, the methods of forming the second patterned photoresist layer 2103 and the second patterned opening regions 2104 are the same as that of forming the first patterned photoresist layer 2101 and the first patterned opening regions 2102 described above.

Figure 2D:
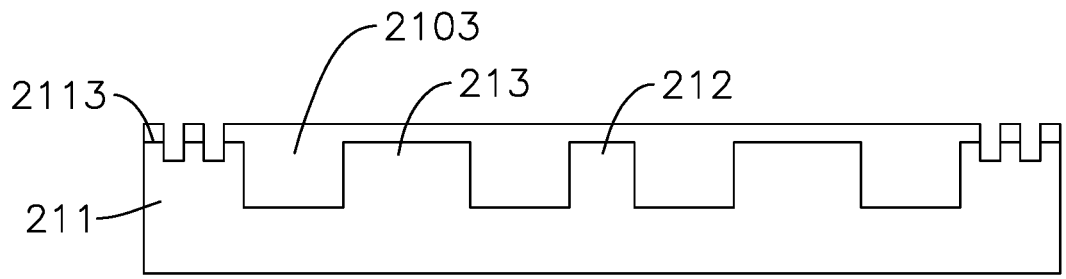

Referring to FIG. 2D, the end 2113 of the first annular convex portion 211 in the second patterned opening regions 2104 is etched.

Figure 2E:
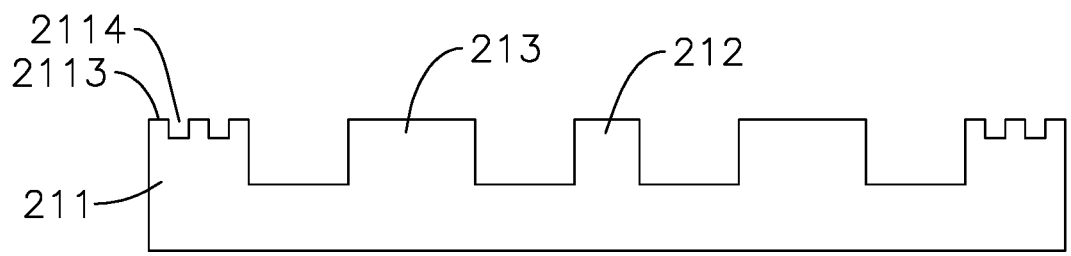

Referring to FIG. 2E, the second patterned photoresist layer 2103 is removed to form multiple first joining portions 2114 at the end 2113 of the first annular convex portion 211.

Figure 2F:
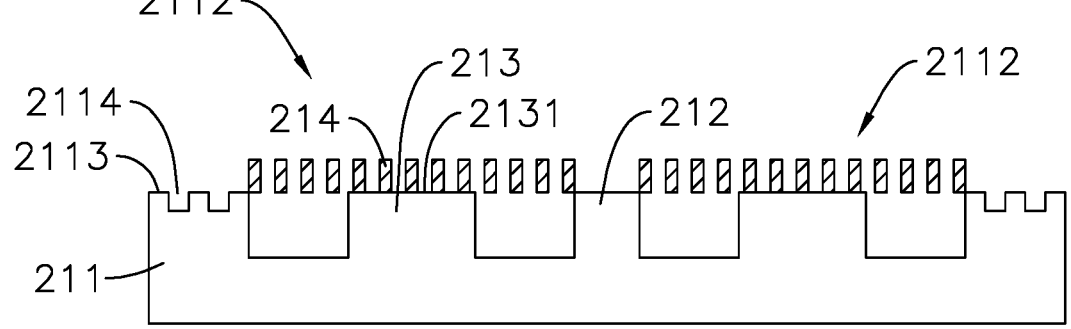
Figure 2F:
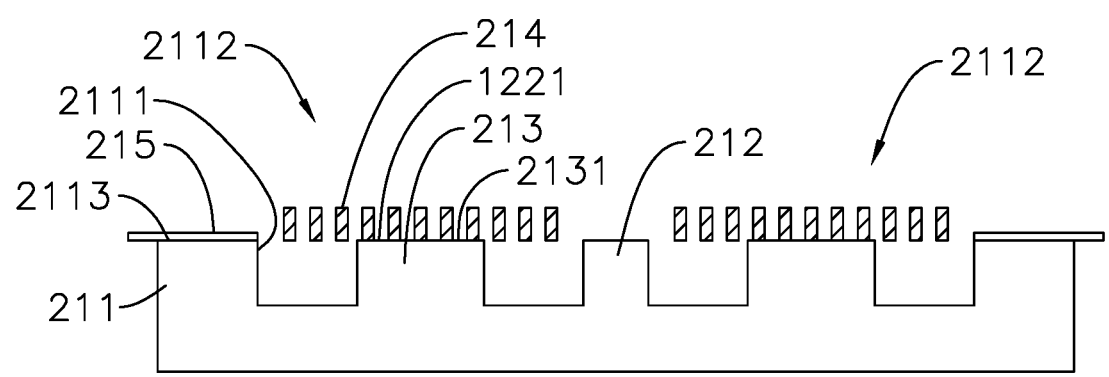
Figure 3:
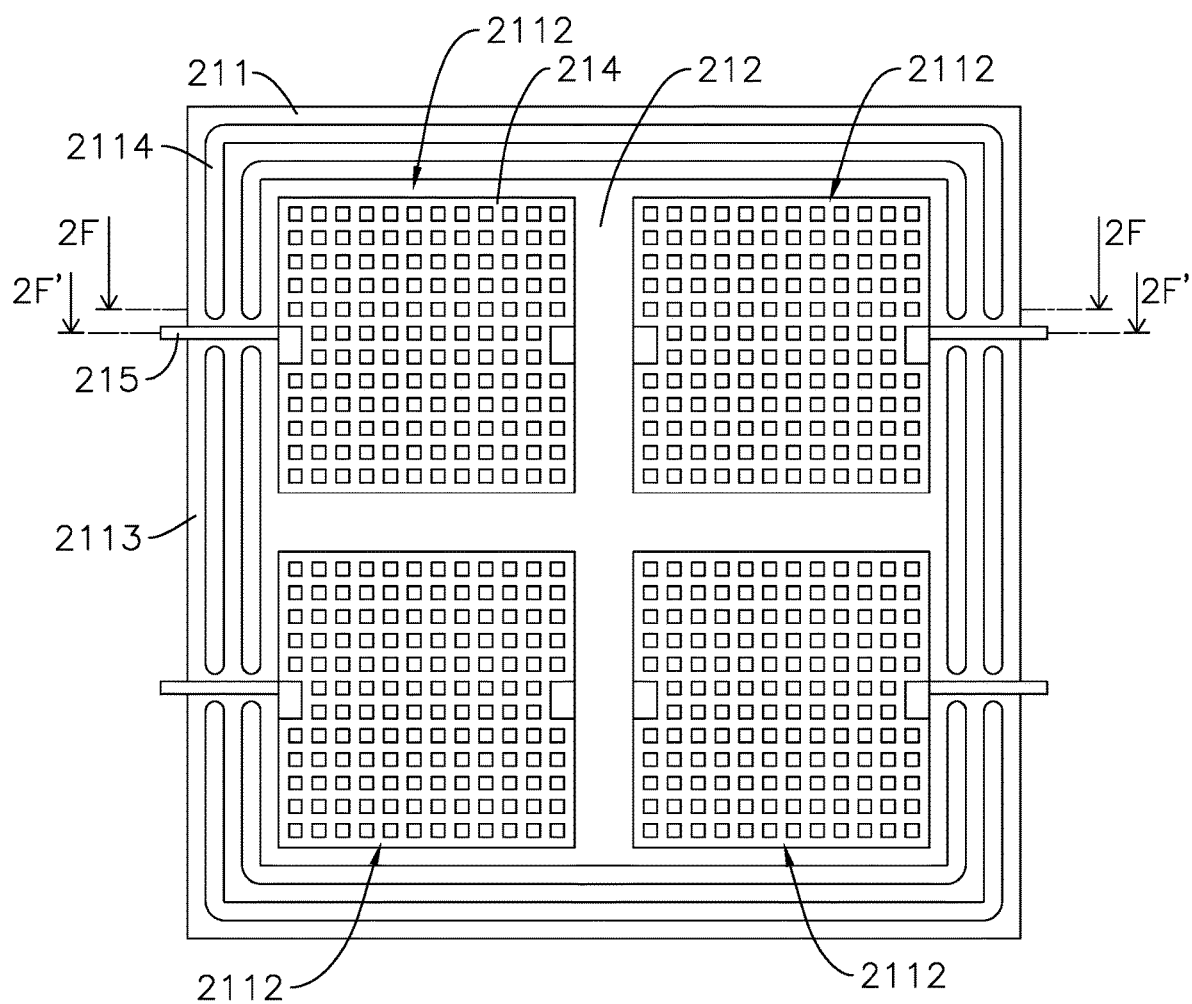
FIG. 3 is a schematic top view of the first substrate corresponding to the steps of FIG. 2F and FIG. 2F' according to one embodiment of the present invention.

Referring to FIG. 2F, which is viewed across the cutting line 2F-2F shown in FIG. 3, a capillary structure 214 is respectively provided on an end 2131 of each diversion bump 213. That is to say, each first chamber 2112 is provided with the capillary structure 214. The capillary structure 214 is not only provided on the end 2131 of each diversion bump 213, but also covers the entire corresponding first chamber 2112.

Referring to FIG. 2F', which is viewed across the cutting line 2F'-2F' shown in FIG. 3, multiple pipes are provided on the end 2113 of the first annular convex portion 211 where the first joining portions 2114 are not formed. The pipes 215 respectively fluidly communicate with one of the first chambers 2112 in the inner region 2111 of the first annular convex portion 211. In this embodiment, the material of the pipes 215 is the same as that of the first substrate 21, and is also a metal or metal alloy with good thermal conductivity, such as copper or its alloy.

FIG. 3 is a schematic top view of the first substrate 21 corresponding to the steps of FIG. 2F and FIG. 2F' according to one embodiment of the present invention.

Referring to FIG. 3, the first annular convex portion 211 surrounds multiple first chambers 2112. The at least one first partition portion 212 is formed between the first chambers 2112 to separate the first chambers 2112 from each other. Each of the first joining portions 2114 is formed by multiple grooves. The grooves and the end 2113 of first annular convex portion 211 together form a surrounding pattern that surrounds the first chamber 2112. In addition, the adjacent grooves of the same first joining portion 2114 are separated by a space into which the pipes 215 can be attached. It means that the pipes 215 are not arranged above the grooves. In the embodiment, the number of the first joining portions 2114 is multiple, and the first joining portions 2114 surround the first chambers 2112 in a concentric pattern. For example, two first joining portions 2114 are arranged around the first chambers 2112 in a shape of homocentric squares. In another example, the number of the first joining portions 2114 may be three or four. In this embodiment, two first joining portions 2114 are taken as an example, but it is not limited thereto.

FIGS. 4A to 4E are schematic cross-sectional views of processing a second substrate of a vapor chamber device according to one embodiment of the present invention.

Figure 4A:
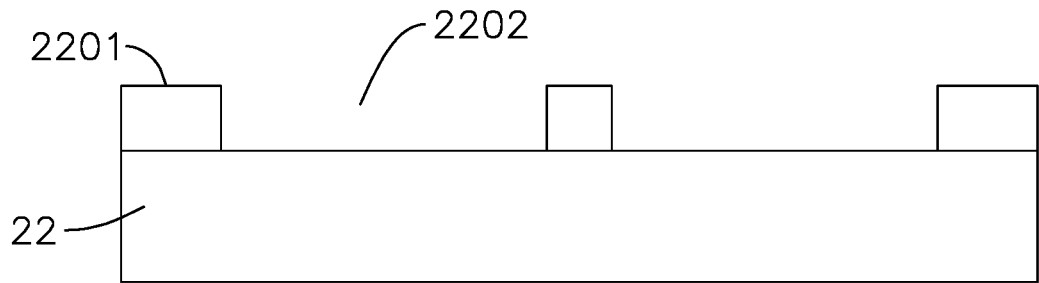
FIGS. 4A to 4E are schematic cross-sectional views of processing a second substrate of a vapor chamber device according to one embodiment of the present invention.

Referring to FIG. 4A, a second substrate 22 is provided, and a third patterned photoresist layer 2201 is formed on the second substrate 22. The third patterned photoresist layer 2201 is defined with multiple third patterned opening regions 2202. In this embodiment, the methods of forming the third patterned photoresist layer 2201 and the third patterned opening regions 2202 are the same as the method of forming the first patterned photoresist layer 2101 and the first patterned opening regions 2102 as described above.

Figure 4B:
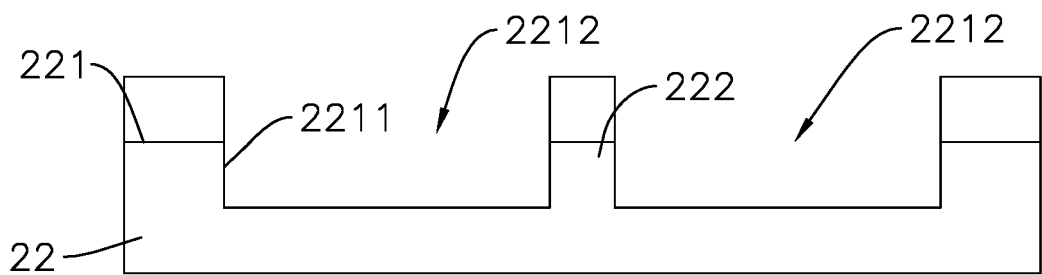

Referring to FIG. 4B, the second substrate 22 exposed from the third patterned opening area 2202 is etched, and the third patterned photoresist layer 2201 is removed to form a second annular convex portion 221 and at least one second partition portion 222 on the second substrate 22. The at least one second partition portion 222 separates an inner area 2211 of the second annular convex portion 221 into multiple second chambers 2212.

Figure 4C:
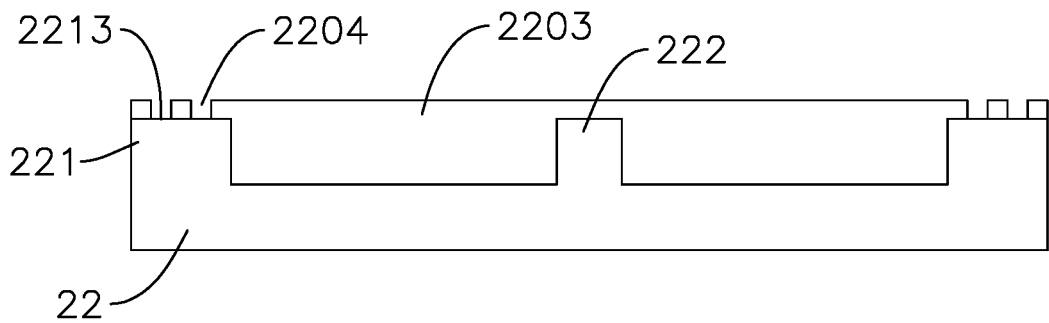

Referring to FIG. 4C, a fourth patterned photoresist layer 2203 is provided on the second substrate 22, and the fourth patterned photoresist layer 2203 is defined with multiple fourth patterned opening regions 2204. The fourth patterned opening regions 2204 correspond to the end 2213 of the second annular convex portion 221. In this embodiment, the method of forming the fourth patterned photoresist layer 2203 and the fourth patterned opening regions 2204 are the same as the method of forming the first patterned photoresist layer 2101 and the first patterned opening regions 2102 as described above.

Figure 4D:
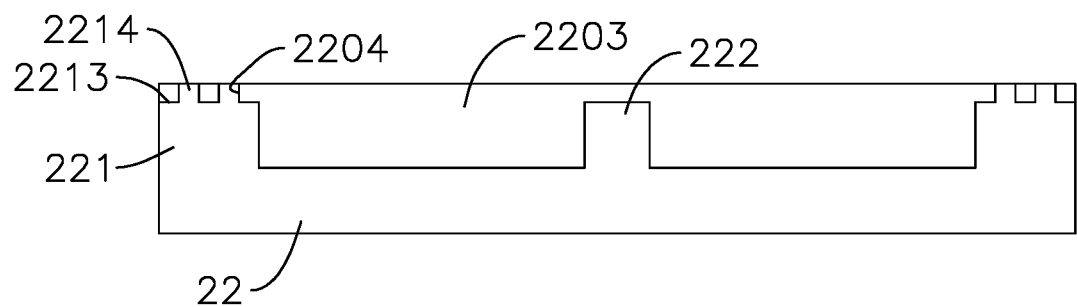

Referring to FIG. 4D, multiple second joining portions 2214 are formed in the fourth patterned opening regions 2204. In this embodiment, the second joining portions 2214 can be formed by electroplating, but not limited thereto.

Figure 4E:
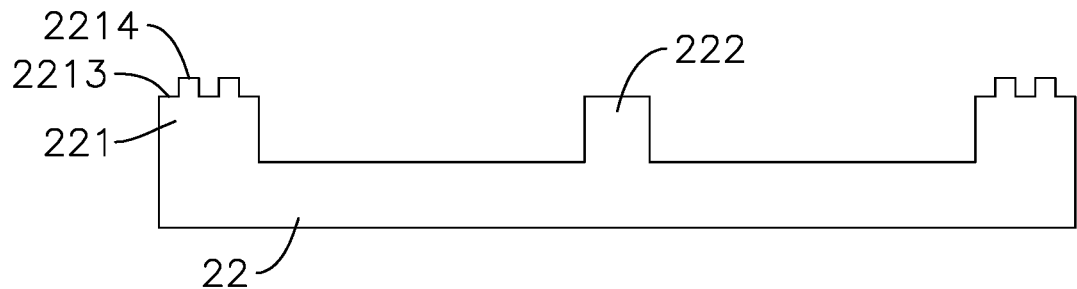

Referring to FIG. 4E, the fourth patterned photoresist layer 2203 is removed and the second joining portions 2214 are formed on the end 2213 of the second annular convex portion 221.

Figure 5A:
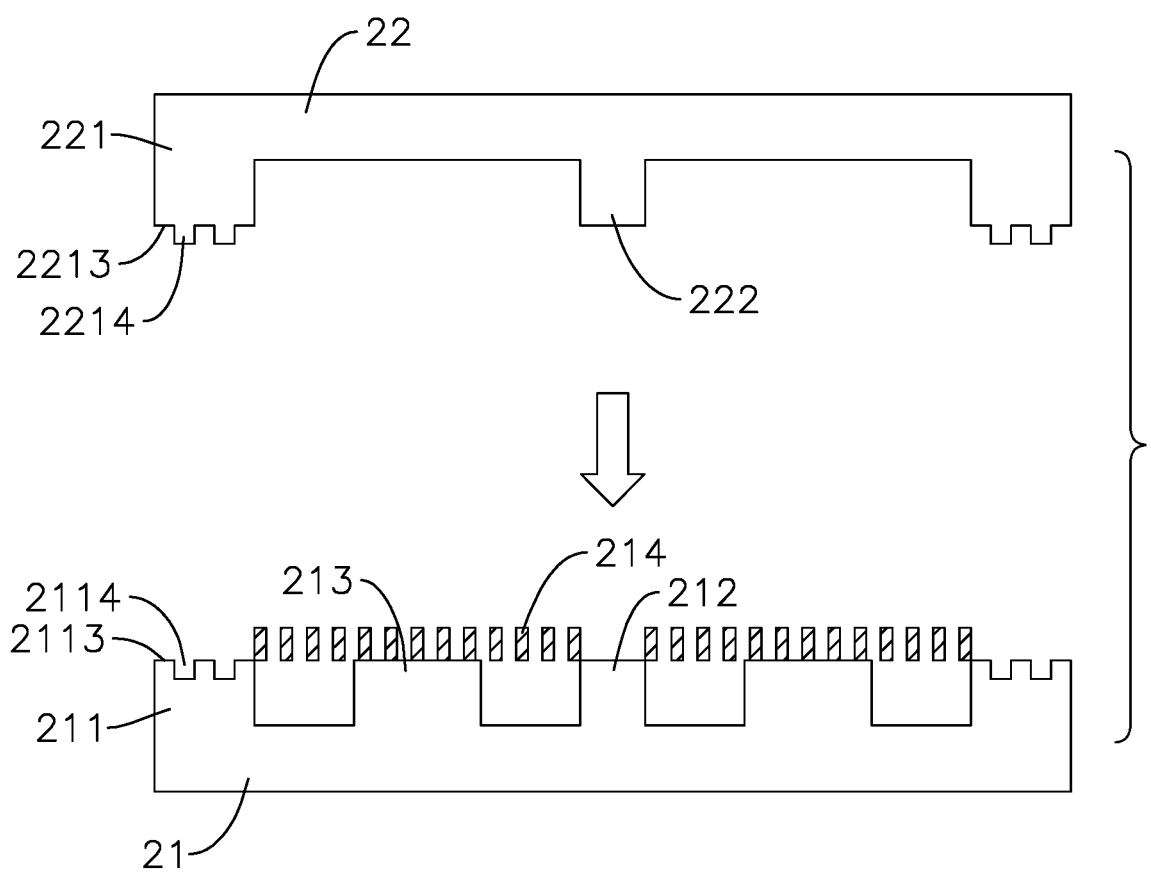
FIG. 5A, FIGS. 5A' to 5E are schematic cross-sectional views of combining the first substrate and the second substrate in a manufacturing method of a vapor chamber device according to one embodiment of the present invention.
Figure 5A:
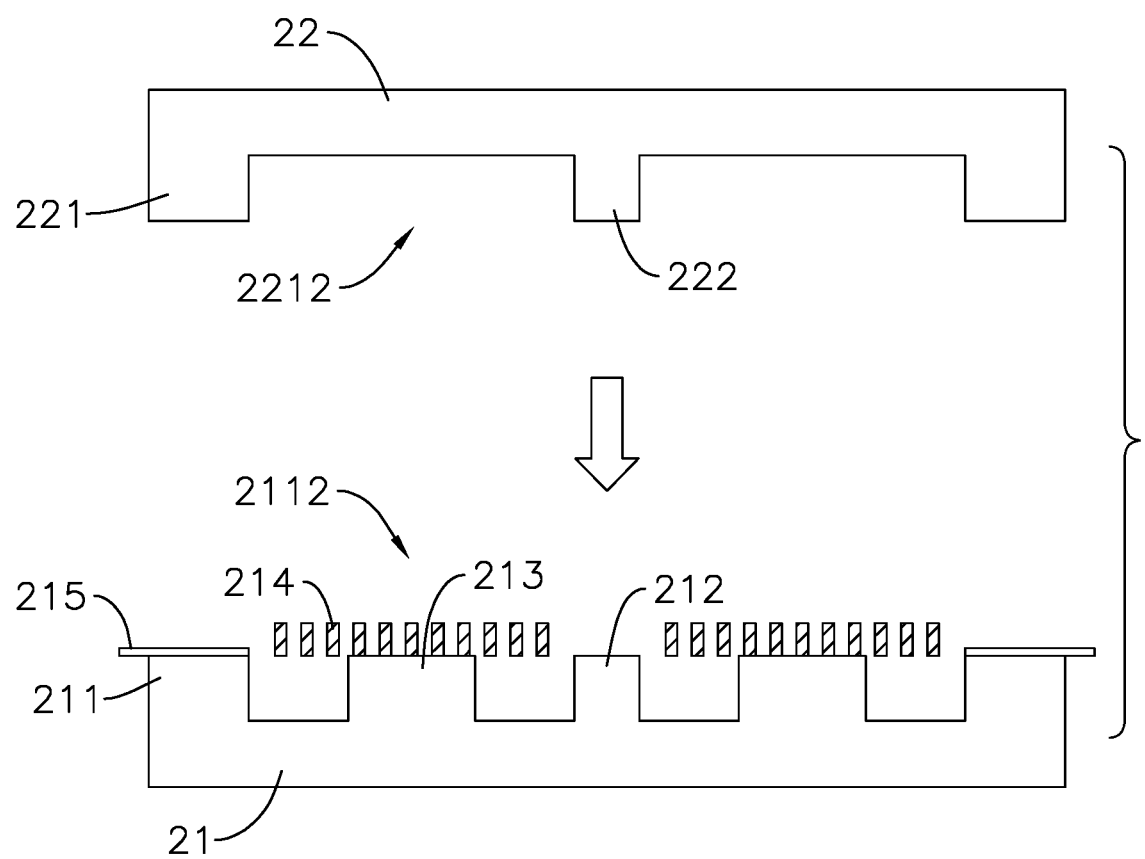

FIG. 5A, FIGS. 5A' to 5E are schematic cross-sectional views of combining the first substrate and the second substrate in a manufacturing method of a vapor chamber device according to one embodiment of the present invention.

Referring to FIG. 5A further, the first substrate 21 is mounted to the second substrate 22. The first annular convex portion 211 of the first substrate 21 is engaged with the second annular convex portion 221 of the second substrate 22, and the at least one first partition portion 212 of the first substrate 21 is connected to the at least one second partition portion 222 of the second substrate 22. Further, the first joining portions 2114 on the end 2113 of the first annular convex portion 211 of the first substrate 21 are joined to the second joining portions 2214 on the end 2213 of the second annular convex portion 221 of the second substrate 22. In this embodiment, the first annular convex portion 211 and the second annular convex portion 221 have the matched shape, and the first partition portion 212 and the second partition portion 222 have the same shape. In addition, the number and shape of the first joining portions 2114 of the first substrate 21 match the number and shape of the second joining portions 2214 of the second substrate 22. For example, the first joining portions 2114 may be, but not limited to, multiple grooves, and the second joining portions 2214 may be, but not limited to, multiple ribs. The first joining portion 2114 and the second joining portion 2214 may have any complementary structures that can engage with each other.

In this embodiment, the first joining portion 2114 and the second joining portion 2214 are concave-convex microstructures that may increase the contact area of the first substrate 21 and the second substrate 22, thereby improving contact tightness and reducing thermal resistance. As the thermal resistance is effectively reduced, the temperature of the welding process is also decreased and more options of materials can be selected to form the housing 10. In this embodiment, the material can be pure copper that can avoid the problem of bad tightness due to metal precipitation resulted from heating treatment of alloy materials.

Referring to FIG. 5A', which is viewed from another direction different from that in FIG. 5A, the pipes 215 are shown in this drawing.

Figure 5B:
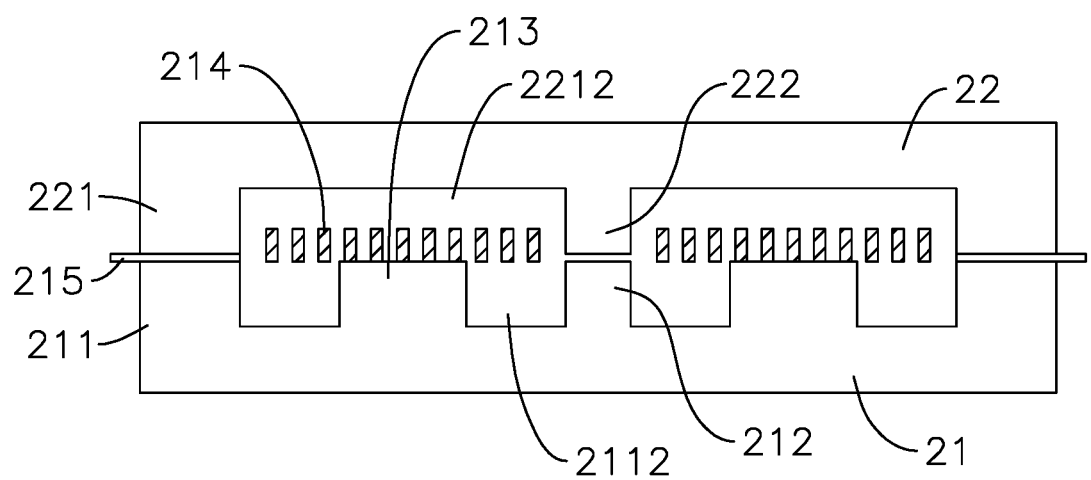

Referring to FIG. 5B, the first substrate 21 and the second substrate 22 are joined together.

Figure 5C:
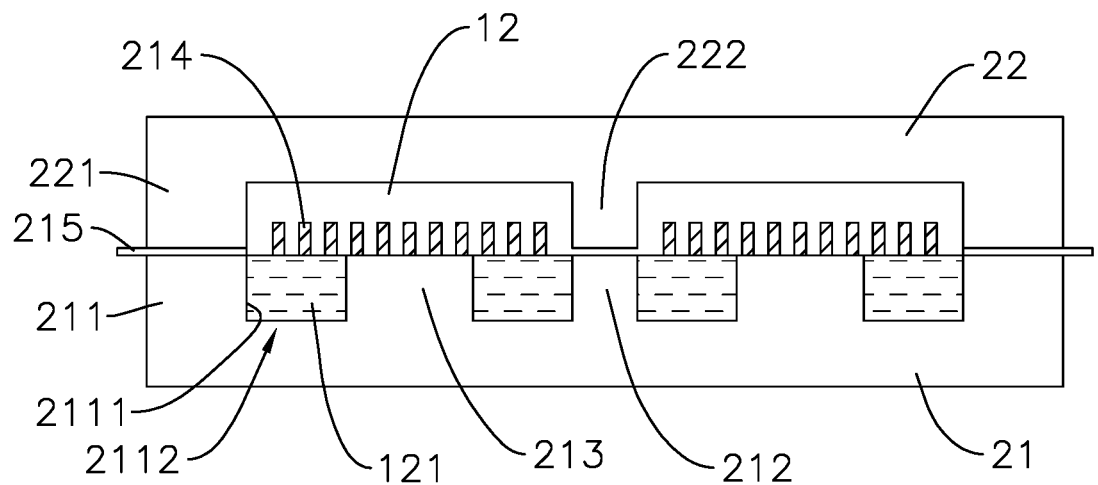

Referring to FIG. 5C, the working fluid 121 is injected into the first chambers 2112 of the first substrate 21 through the pipes 215, and the first chambers 2112 are also evacuated through the pipes 215.

Figure 5D:
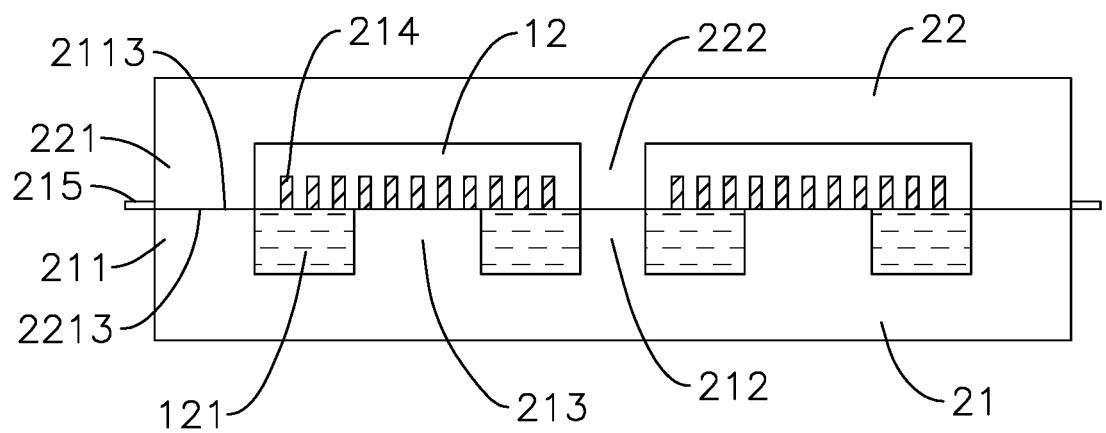

Referring to FIG. 5D, the first substrate 21 and the second substrate 22 are compressed together, so one end 2113 of the first annular convex portion 211 of the first substrate 21 can be tightly connected with one end 2213 of the second annular convex portion 221 of the second substrate 22, and one end of each of the at least one first partition portion 212 of the first substrate 21 can be tightly connected with one end of each of the at least one second partition portion 222 of the second substrate 22.

In this embodiment, the first substrate 21 and the second substrate 22 are connected with each other by welding, and are tightly joined with each other by heating and compressing.

Figure 5E:
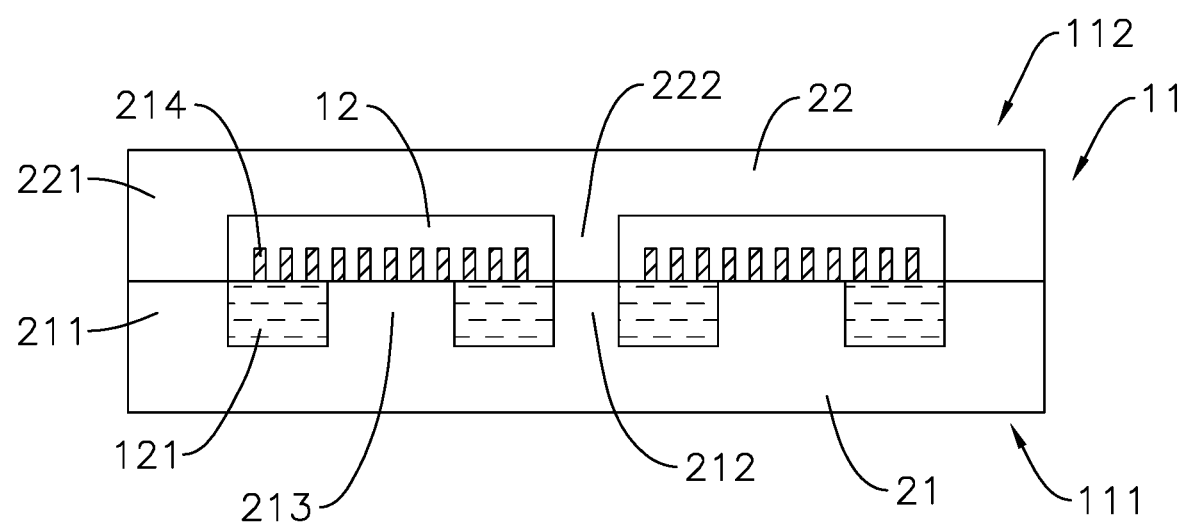

Referring to FIG. 5E, the pipes 215 exposed from the housing 10 are cut off.

In this embodiment, the shape, the number and the positions of the second annular convex portion 221, the at least one second partition portion 222, and the second chambers 2212 match those of the first annular convex portion 211, the at least one first partition portion 212 and first chambers 2112, respectively. Therefore, after the first substrate 21 and the second substrate 22 are joined together, the first chambers 2112 and the second chambers 2212 can respectively form the chambers 12 that cannot fluidly communicate with each other. Further, the first substrate 21 and the second substrate 22 are connected to form the housing 11, and the first substrate 21 is the second shell 112 of the housing 11, and the second substrate 22 is the first shell 111 of the housing 11.

The manufacturing method of the vapor chamber device of the present invention adopts photolithography. The photolithography can be performed on a large substrate. Such a large substrate can be cut to manufacture multiple independent vapor chamber devices.

Based on the above, the manufacturing method of the present invention can manufacture the vapor chamber device to meet specific sizes and shapes of different heat sources. Therefore, the vapor chamber device can match the shape of the heat source and highly attached to the heat source, thereby increasing the heat dissipation efficiency. Further, as the vapor chamber device has multiple independent chambers, when the vapor chamber device is placed vertically, the chambers at an upper portion of the vapor chamber device still contain the working fluid for heat exchange. The working fluid may not all flow to a bottom of the vapor chamber device, thereby avoiding the problem of poor heat exchange at the upper portion. The vapor chamber device of the present invention can be in various shapes, such as square, round, etc., to match different heat sources.

What is claimed is:

1. A vapor chamber device comprising:
   a housing having a first shell and a second shell, wherein the first shell is opposite to the second shell; and
   multiple independent chambers formed between the first shell and the second shell; wherein each of the independent chambers is provided with
   a working fluid;
   at least one diversion bump formed on an inner surface of the second shell; and
   a capillary structure mounted on an end of the at least one diversion bump.

2. The vapor chamber device as claimed in claim 1, wherein the housing further comprises:
   at least one partition wall mounted between the first shell and the second shell, and two opposite ends of the at least one partition wall being respectively connected to the first shell and the second shell to separate the multiple chambers from one another.

3. A manufacturing method of a vapor chamber device comprising:
   providing a first substrate;
   forming a first annular convex portion, at least one first partition portion, and multiple diversion bumps on the first substrate, wherein the diversion bumps are separated by the at least one first partition portion and the at least one first partition portion separates an inner area within the first annular convex portion into multiple first chambers;
   mounting a capillary structure on one end of each diversion bump;
   providing a second substrate;
   forming a second annular convex portion and at least one second partition portion on the second substrate;
   joining the first substrate and the second substrate; wherein the first annular convex portion of the first substrate is joined to the second annular convex portion of the second substrate, and the at least one first partition portion of the first substrate is connected to the at least one second partition portion of the second substrate;
   injecting a working fluid into the first chambers in the inner area within the first annular convex portion of the first substrate and evacuating the first chambers; and
   compressing the first substrate and the second substrate, wherein one end of the first annular convex portion of the first substrate is tightly fitted with one end of the second annular convex portion of the second substrate, and one end of each of the at least one first partition portion of the first substrate is tightly fitted with one end of each of the at least one second partition portion of the second substrate;
   wherein the at least one first partition portion is formed between the first chambers to separate the first chambers from each other.

4. The method as claimed in claim 3, further comprising:
   when the capillary structure is mounted on the end of each diversion bump, placing multiple pipes on the end of the first annular convex portion; wherein the multiple pipes respectively fluidly communicate with the first chambers within the inner area of the first annular convex portion of the first substrate;

injecting the working fluid into the first chambers and evacuating the first chambers through the pipes;

after compressing the first substrate and the second substrate, cutting off the pipes that are exposed from the first substrate and the second substrate.

5. The method as claimed in claim 3, further comprising:

after forming the first annular convex portion, the at least one first partition portion and the diversion bumps on the first substrate, further forming multiple first joining portions on the end of the first annular convex portion;

after forming the second annular convex portion and the at least one second partition portion on the second substrate, further forming multiple second joining portions on the end of the second annular convex portion; and when joining the first substrate and the second substrate, further connecting the first joining portions of the first substrate and the second joining portions of the second substrate.

6. The method as claimed in claim 3, the step of forming the first annular convex portion, the at least one first partition portion, and the diversion bumps on the first substrate further comprising:

forming a first patterned photoresist layer on the first substrate, the first patterned photoresist layer defined with multiple first patterned opening regions;

etching the first substrate exposed from the first patterned opening regions; and removing the first patterned photoresist layer to form the first annular convex portion, the at least one first partition portion and the diversion bumps on the first substrate.

7. The method as claimed in claim 5, the step of forming multiple first joining portions at the end of the first annular convex portion comprising:

forming a second patterned photoresist layer on the first substrate, the second patterned photoresist layer being defined with multiple second patterned opening regions corresponding to the end of the first annular convex portion;

etching the end of the first annular convex portion exposed from the second patterned opening regions;

removing the second patterned photoresist layer to form the first joining portions on the end of the first annular convex portion.

8. The method as claimed in claim 3, the step of forming the second annular convex portion and the at least one second partition portion on the second substrate comprising:

forming a third patterned photoresist layer on the second substrate, the third patterned photoresist layer being defined with multiple third patterned opening regions;

etching the second substrate exposed from the third patterned opening regions; and removing the third patterned photoresist layer to form the second annular convex portion and the at least one second partition portion on the second substrate.

9. The method as claimed in claim 5, the step of forming multiple second joining portions at the end of the second annular convex portion comprising:

forming a fourth patterned photoresist layer on the second substrate, the fourth patterned photoresist layer being defined with multiple fourth patterned opening regions corresponding to the end of the second annular convex portion;

etching the end of the second annular convex portion exposed from the fourth patterned opening regions;

removing the fourth patterned photoresist layer to form the second joining portions at the end of the second annular convex portion.

10. The method as claimed in claim 9, wherein the second joining portions are formed by electroplating.

* * * * *